(12) United States Patent
Uno et al.

(10) Patent No.: US 7,712,333 B2
(45) Date of Patent: May 11, 2010

(54) METHOD FOR SMOOTHING A SURFACE OF A GLASS SUBSTRATE FOR A REFLECTIVE MASK BLANK USED IN EUV LITHOGRAPHY

(75) Inventors: Toshiyuki Uno, Guilderland, NY (US); Yoshiaki Ikuta, Schenectady, NY (US); Mika Yokoyama, Yokohama (JP); Ken Ebihara, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 779 days.

(21) Appl. No.: 11/391,343

(22) Filed: Mar. 29, 2006

(65) Prior Publication Data

US 2007/0240453 A1    Oct. 18, 2007

(51) Int. Cl.
C03C 17/02 (2006.01)
(52) U.S. Cl. ............... 65/28; 65/60.1; 65/60.5; 65/36; 65/102; 427/140; 427/375
(58) Field of Classification Search ............... 65/60.1, 65/60.5, 28, 36, 102; 427/140, 375
See application file for complete search history.

(56) References Cited

U.S. PATENT DOCUMENTS

| | | | | |
|---|---|---|---|---|
| 3,259,480 | A * | 7/1966 | Michalik et al. | 65/28 |
| 3,352,655 | A * | 11/1967 | Barch et al. | 65/28 |
| 3,775,075 | A * | 11/1973 | Keck et al. | 65/421 |
| 4,363,647 | A * | 12/1982 | Bachman et al. | 65/17.4 |
| 4,388,344 | A * | 6/1983 | Shuskus et al. | 427/576 |
| 4,661,369 | A * | 4/1987 | Crane | 427/8 |
| 4,731,254 | A * | 3/1988 | Heineken et al. | 427/554 |

(Continued)

FOREIGN PATENT DOCUMENTS

| | | | | |
|---|---|---|---|---|
| JP | 59083950 | A | * | 5/1984 |
| JP | 59088332 | A | * | 5/1984 |
| JP | 60033234 | A | * | 2/1985 |
| JP | 06264266 | A | * | 9/1994 |

OTHER PUBLICATIONS

U.S. Appl. No. 12/122,407, filed May 16, 2008, Sugiyama et al.

(Continued)

*Primary Examiner*—Steven P Griffin
*Assistant Examiner*—Erin Snelting
(74) *Attorney, Agent, or Firm*—Oblon, Spivak, McClelland, Maier & Neustadt, L.L.P.

(57) ABSTRACT

To provide a method for smoothing a surface of a glass substrate having a concave defect, such as a pit or a scratch.

A method for smoothing a surface of a glass substrate having a concave defect thereon, comprising: forming a film on the surface of the glass substrate having the concave defect by a dry deposition method, the film comprising a glass material having a fluid point Tf of 150° C. or above and of not higher than a strain point Ts (° C.) of the glass substrate; and heating the film of the glass material at a temperature of not lower than Tf and not higher than Ts to put the film in such state that the film of the glass material can flow so as to bury the concave defect, followed by cooling the film of the glass material, thereby to smooth the surface of the glass substrate having the concave defect.

19 Claims, 1 Drawing Sheet

U.S. PATENT DOCUMENTS

| | | | |
|---|---|---|---|
| 5,104,482 A * | 4/1992 | Monkowski et al. | 438/698 |
| 5,162,136 A * | 11/1992 | Blum et al. | 427/226 |
| 5,595,583 A * | 1/1997 | Murnick | 65/350 |
| 5,948,468 A * | 9/1999 | Sweatt et al. | 427/140 |
| 6,044,192 A * | 3/2000 | Grant et al. | 385/129 |
| 6,877,341 B1 * | 4/2005 | Hong | 65/28 |
| 2004/0159538 A1 * | 8/2004 | Becker et al. | 204/192.11 |

OTHER PUBLICATIONS

"Specification for Extreme Ultraviolet Lithography Mask Substrates", SEMI P37-1102, SEMI 2001, 2002, pp. 1-10.

"Specification for Absorbing Film Stacks and Multilayers on Extreme Ultraviolet Lithography Mask Blanks", SEMI P38-1102, SEMI 2002, pp. 1-8.

Alan Stivers, et al., "Evaluation of the Capability of a Multibeam Confocal Inspection System for Inspection of EUVL Mask Blanks", $22^{nd}$ Annual BACUS Symposium on Photomask Technology, Proceedings of SPIE, vol. 4889, 2002, pp. 408-417.

* cited by examiner

METHOD FOR SMOOTHING A SURFACE OF A GLASS SUBSTRATE FOR A REFLECTIVE MASK BLANK USED IN EUV LITHOGRAPHY

BACKGROUND OF THE INVENTION

1. Field of the Invention

The present invention relates to a method for smoothing a surface of a glass substrate. More specifically, the present invention relates to a method for smoothing a surface of a glass substrate having a concave defect.

The present invention also relates to a substrate for a reflective mask blank used in EUV (Extreme Ultra Violet) lithography (hereinbelow, referred to as "EUV mask blank" in Description), which is obtainable by the smoothing method, and an EUV mask blank using the substrate.

2. Discussion of Background

A mask blank used in EUV lithography (hereinbelow, referred to as "EUV mask blank" in Description) is fabricated by forming a reflective film and an absorbing layer on a super-polished substrate in this order. It is most common that the reflective film comprises a reflective multilayer film having Mo films and Si films alternately stacked therein.

If a fine irregularity exists on the surface of a substrate used for fabrication of an EUV mask blank, the irregularity has an adverse effect on the reflective film and the absorbing layer, which are formed on the substrate. For example, if a fine irregularity exists on the surface of a substrate, the periodic structure of a multilayer reflective film formed on the substrate is disordered. When a desired pattern of a mask is printed on a photosensitive organic film (a so-called photo resist film) on a Si wafer by using a an exposing system, a portion of the desired pattern may have a lack of pattern or an excessive pattern other than the desired pattern is formed in some cases. The disorder in the periodic structure of a reflective multilayer film, which is caused by an irregularity existing on a substrate, is called a phase defect, which causes an important problem. It is desired that no irregularities having a size of a certain value or above exist on a substrate.

Non-patent documents 1 and 2 describe requirements relating to a defect in an EUV mask and an EUV mask blank. The requirements for such a defect are significantly severe. Non-patent document 1 describes that a defect having a size of 50 nm or above is not permissible since the presence of such a defect on a substrate causes disorder of the structure in a reflective film to form an unexpected shape in a pattern projected onto a resist on a Si wafer. Non-patent document 1 also describes that the surface roughness of a substrate needs to be less than 0.15 nm in RMS (root-mean-square) in order to prevent the roughness of a line edge from increasing in a pattern projected onto a resist on a Si wafer. Non-patent document 2 describes that it is not permissible that a defect having a size of 25 nm or above exists on a reticle coated with a reflective film, which is used in EUV lithography. Non-patent document 3 describes what size of defect on a substrate can be printed. Non-patent document 3 describes that there is a possibility that a phase defect changes a line width of a printed image. A phase defect including a surface bump having a height of 2 nm and a FWHM (full width of half maximum) of 60 nm is a phase defect that is at the border line as to whether the phase defect can be printed or not. This document describes that a defect having such a size causes an impermissible change of 20% in line width (140 nm on a mask) with respect to a line having a width of 35 nm.

Non-Patent Document 1: SEMI, P. 37-1102 (2002), "Specification for extreme ultraviolet lithography mask substrate"

Non-Patent Document 2: SEMI, P. 38-1102 (2002), "Specification for absorbing film stacks and multilayers on extreme ultraviolet lithography mask blanks"

Non-Patent Document 3; SPIE, vol. 4889, Alan Stivers., et. al., p. 408-417 (2002), "Evaluation of the Capability of a Multibeam Confocal Inspection System for Inspection of EUVL Mask Blanks"

SUMMARY OF THE INVENTION

It is an object of the present invention to solve the problem of the prior art described above and to provide a method for smoothing a surface of a glass substrate having a concave defect, such as a pit or a scratch.

It is another object of the present invention to provide a substrate for an EUV mask blank, which is obtainable by the method for smoothing such a surface.

It is a further object of the present invention to provide a substrate with a reflective multilayer film for an EUV mask blank, which comprises the above-mentioned substrate for an EUV mask blank, and an EUV mask blank.

In order to attain the above-mentioned objects, the present invention provides a method for smoothing a surface of a glass substrate having a concave defect thereon, comprising forming a film on the surface of the glass substrate having the concave defect by a dry deposition method, the film comprising a glass material having the fluid point Tf of 150° C. or above and of not higher than the strain point Ts (° C.) of the glass substrate; and heating the film of the glass material at a temperature of not lower than Tf and not higher than Ts to put the film in such state that the film of the glass material can flow so as to bury the concave defect, followed by cooling the film of the glass material, thereby to smooth the surface of the glass substrate having the concave defect (hereinbelow, referred to as "the substrate concave-defect smoothing method according to the present invention").

In the substrate concave-defect smoothing method according to the present invention, it is preferred that the glass material comprise oxide glass containing phosphorus, boron and silicon as main components.

In the substrate concave-defect smoothing method according to the present invention, it is preferred that the film comprising the glass material before heat treatment have a thickness of from 20 to 300 nm.

In the substrate concave-defect smoothing method according to the present invention, it is preferred that the concave defect on the surface of the glass substrate have a depth of 30 nm or below.

In the substrate concave-defect smoothing method according to the present invention, it is preferred that a concave defect on a surface of the film of the glass material after cooling have a depth of 3 nm or below.

The present invention also provides a substrate for a reflective mask blank used for EUV lithography, which is obtainable by the substrate concave-defect smoothing method according to the present invention.

The present invention also provides a substrate with a reflective multilayer film for a reflective mask blank used for EUV lithography, using the substrate for a reflective mask blank used for EUV lithography, which is obtainable by the substrate concave-defect smoothing method according to the present invention.

The present invention also provides a reflective mask blank used for EUV lithography, using the substrate for a reflective mask blank used for EUV lithography, which is obtainable by the substrate concave-defect smoothing method according to the present invention.

EXPLANATION OF REFERENCE NUMERALS

Figure 1:
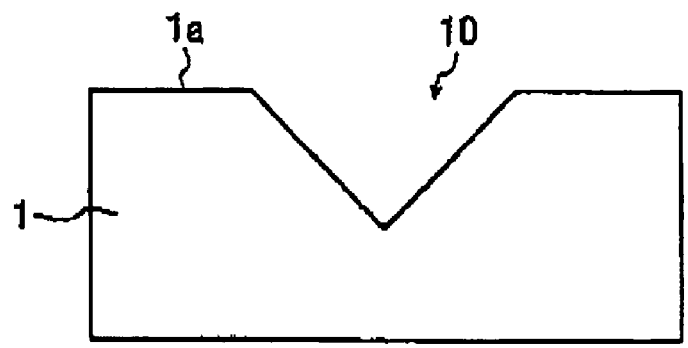
FIG. 1 is a schematic view showing a portion of the surface for deposition on a substrate with a concave defect existing thereon and its neighboring area.

1: substrate
1a: deposition surface
2: film
10: concave defect

DETAILED DESCRIPTION OF THE PREFERRED EMBODIMENTS

In accordance with the substrate concave-defect smoothing method of the present invention, a substrate surface, which has a concave defect, specifically a concave defect having a depth of 30 nm or below, can be smoothed, and the depth of such a concave defect on the substrate surface, more specifically, the depth of such a concave defect on a surface of a film, which is formed on the substrate and is made of a glass material, can be reduced to 3 nm or below. In accordance with the substrate concave-defect smoothing method of the present invention, it is possible to provide a substrate for an EUV mask blank, which has an excellent surface smoothness.

A convex defect, such as a foreign particle or a fiber, among fine irregularities existing on a substrate surface, can be removed by a conventional wet cleaning method using fluorinated acid or ammonia water, by brush-cleaning, by fine polishing or by another method.

However, a concave defect, such as a pit or a scratch, cannot be removed by these methods. When the wet cleaning method using fluorinated acid or ammonia water is applied to remove a convex defect, a concave defect could be newly formed on the substrate surface since it is necessary to slightly etch the substrate surface in order to remove the convex defect from the substrate by lift-off. Even when brush-cleaning is applied to remove a convex defect, a concave defect could be newly formed on the substrate surface.

A convex defect existing on a substrate surface can be removed by the conventional wet cleaning method using fluorinated acid or ammonia water, by brush-cleaning or by fine polishing. Although a concave defect could be newly formed on the substrate surface when these methods are applied for the purpose of removing such a convex defect, the concave defect can be reduced by the substrate concave-defect smoothing method according to the present invention.

In a case where the presence of a concave defect on a substrate surface causes a problem, when the concave defect on the substrate is covered by a method, it is important that neither convex defect nor concave defect exists on the surface of a film-like material, which has covered the concave defect. In accordance with the smoothing method of the present invention, a film made of a specific glass material can be used to prevent a convex defect or a concave defect from existing even after formation of the film.

Accordingly, in accordance with the substrate concave-defect smoothing method of the present invention, it is possible to provide a substrate for an EUV mask blank, which has neither convex defect nor concave defect existing thereon and has an excellent smoothness.

Now, the substrate concave-defect smoothing method of the present invention will be described.

The substrate concave-defect smoothing method according to the present invention is mainly used for the purpose of smoothing a surface of a substrate for an EUV mask blank, more specifically a surface of a substrate with a reflective multilayer film and an absorbing layer formed in the fabrication process of an EUV mask blank (hereinbelow referred to as "deposition surface"). A surface of a substrate with a film for a static chuck formed thereon to hold an EUV mask blank may be smoothed by the smoothing method according to the present invention. Now, description will be made about a case where the deposition surface of a substrate for an EUV mask blank is smoothed.

When the substrate concave-defect smoothing method according to the present invention is performed, the deposition surface of a prepared substrate for an EUV mask blank is first polished by abrasive grains made of, e.g., a cerium oxide, a zirconium oxide or colloidal silica, is cleaned by an acid solution, such as fluorinated acid, silicofluoric acid or sulfuric acid, by an alkaline solution, such as ammonia water or by pure water and is dried. If a convex defect, such as a foreign particle or a fiber, exists on the deposition surface, the convex defect is removed by these steps.

The substrate concave-defect smoothing method according to the present invention is favorably applied to a substrate that has a concave defect existing on the deposition surface after surface polishing and cleaning.

A substrate for an EUV mask blank is required to have a high smoothness and a high flatness over the entire deposition surface. Specifically, the deposition surface of a substrate is required to have a smooth surface having a surface roughness of 0.15 nm or below in Rms (root-mean-square) and a flatness of 50 nm or below. However, even if the deposition surface meets the requirements in terms of these values, a concave defect, which is called a pit or a scratch, locally exists on the deposition surface in some cases.

When the size of a concave defect existing on the deposition surface of a substrate is quite small, it is not probable that the concave defect has no adverse effect on an EUV mask blank, which is fabricated on the substrate. However, when a concave defect, which has a size of a certain value or above, exists on a deposition surface, a concave defect appears on the surface of a reflective multilayer film or the surface of an absorbing layer formed on the deposition surface, causing a defect in an EUV mask blank, in some cases. Specifically, when a concave defect having a depth of more than 3 nm exists on a deposition surface, a concave defect appears on the surface of a reflective multilayer film or the surface of an absorbing layer formed on the deposition surface, causing a defect in an EUV mask blank.

It is preferred that the substrate for an EUV mask blank have a low thermal expansion coefficient (preferably of $0\pm1.0\times10^{-8}/°C$, more preferably of $0\pm0.3\times10^{-8}/°C$) in addition to being excellent at smoothness and flatness. A specific example of the substrate having a low thermal expansion coefficient is a substrate made of glass having a low thermal expansion coefficient, such as $SiO_2$—$TiO_2$ glass. However, the substrate is not limited to be of this type. It is acceptable to use a substrate made of crystallized glass with a β-quartz solid solution precipitated.

It is preferred that the substrate for an EUV mask blank have an excellent resistance to a cleaning liquid to be used for, e.g., cleaning a photomask after formation of an EUV mask blank or a pattern.

In order to avoid deformation caused by a film stress of a reflective multilayer film or an absorbing layer formed on the substrate, it is preferred that the substrate for an EUV mask blank have a high rigidity. It is particularly preferred that the substrate have a high Young's modulus of 65 GPa or above.

The size and the thickness of the substrate for an EUV mask blank are properly determined by, e.g., design values of a mask, A specific example of the substrate is a substrate having outer dimensions of about 6 inch (152.4 mm) square and a thickness of about 0.25 inch (6.3 mm).

FIG. 1 is a schematic view showing a portion of the deposition surface of a substrate with a concave defect existing thereon and its neighboring area. In FIG. 1, the concave defect 10 is formed in a substantially V character shape on the deposition surface 1a on the substrate 1. The concave defect 10 has a depth of, e.g., 30 nm.

Figure 2:
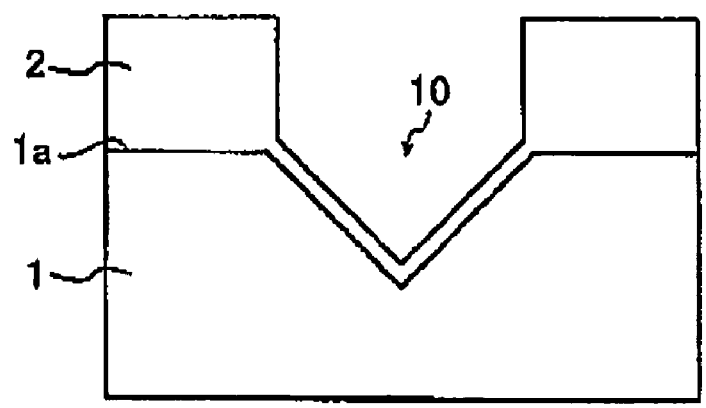
FIG. 2 shows a state wherein a film made of a glass material is formed on the surface for deposition 1a on the substrate 1 shown in FIG. 1 (before heat treatment)

In the substrate concave-defect smoothing method according to the present invention, a film, which is made of a glass material is formed on the deposition surface 1a on the substrate 1 by using a dry deposition method. FIG. 2 shows a state wherein the film 2 of such a glass material has been formed on the deposition surface 1a on the surface 1 shown in FIG. 1 (before heat treatment). In FIG. 2, the film 2 has a thickness of about 70 nm, which is slightly larger than the depth of the concave defect 10.

In the substrate concave-defect smoothing method according to the present invention, the film 2 is made a glass material, which has a fluid point Tf of not lower than 150° C. and of not higher than the strain point Ts (° C.) of the substrate 1. The fluid point Tf is the temperature at which the glass material forming the film 2 has a viscosity of $10^7$ P (log η=7.0). On the other hand, the strain point Ts of the substrate 1 is the temperature at which the material forming the substrate 1, i.e., glass having a low thermal expansion coefficient, such as $SiO_2$—$TiO_2$ glass, or crystallized glass with a β-quartz solid solution precipitated has a viscosity of $4\times10^{14}$ P (log η=14.6). The strain point Ts may be measured according to JIS R3103 (1995).

The viscosity of a glass material may be measured by a parallel plate viscometry (ASTM-C 338-93) (wherein a sample glass disk, which has a diameter of from 6 to 8 mm and a thickness of from 3 to 5 mm, is sandwiched between horizontal parallel plates in a furnace having a good thermal insulation, and a load is vertically applied to the sample, and wherein the viscosity of the sample can be calculated based on the reduction rate in the thickness of the sample, the load, the geometric dimensions of the sample, and the thermal expansion coefficient).

It should be noted that the composition analysis of each thin film was made, and a bulk material corresponding to the composition of each thin film was prepared, followed by using the above-mentioned method to evaluate the viscosity in the examples of the present invention.

In a case where the material forming the film 2 has a fluid point Tf of lower than 150° C., there is a possibility that when an EUV mask blank, which is fabricated using the substrate 1, is subjected to mask patterning, the film 2 is fluidized to damage a reflective multilayer film and an absorbing layer formed on the film 2, in particular such a reflective multilayer film.

In a case where the material forming for the film 2 has a fluid point Tf higher than the strain point Ts of the substrate 1, it is difficult to carry out fluidization by subjecting the film 2 to heat treatment as described later.

The strain point Ts of the substrate 1 is from 1,050 to 1,200° C. for $SiO_2$—$TiO_2$ glass, although the strain point varies according to the material forming the substrate 1.

Examples of the glass material, the fluid point Tf of which is in the above-mentioned range, include oxide glass containing phosphorus, boron and silicon as main components (Tf: from 350 to 700° C.), solder glass ($PbO$—$B_2O_3$—$SiO_2$) (Tf: from 380 to 580° C.), $PbO$—$SiO_2$ glass, lead borate glass ($PbO$—$B_2O_3$—$SiO_2$—$Al_2O_3$, $PbO$—$ZnO$—$B_2O_3$) (Tf: from 300 to 450° C.), and $Li_2O$—$ZnO$—$MgO$—$P_2O_5$ glass.

Among these kinds of glass, oxide glass containing phosphorus, boron and silicon as the main components is preferred in terms of having a low melting point, of being capable of smoothing a substrate defect and of preventing a defect from being newly caused. It is supposed that the characteristics of this glass, such as a fluidity, are excellent in terms of being capable of smoothing a defect and of preventing a defect from being newly caused.

It should be noted that the phrase "containing phosphorus, boron and silicon and main components" means that the total content of phosphorus, boron, silicon and oxygen is 90 mass % or above.

The size or the depth of the concave defect on a substrate is not uniform. There are various kinds of concave defects. The use of such oxide glass is preferred since it is possible to smooth various concave defects, irrespective of what shape the concave defects have.

It is preferred that the film 2 have a thickness substantially equal to or larger than the depth of the concave defect 10 as shown in FIG. 2. When the film 2 has a thickness substantially equal to or larger than the depth of the concave defect 10, the depth of the concave defect that appears on the surface of the film 2 can be successfully be reduced by subjecting the film 2 to heat treatment as described later, with the result that it is possible to improve the smoothness of the surface of the film 2. The thickness of the film 2 means the thickness of the film 2 before heat treatment.

It is preferred that the thickness of the film 2 range from 20 to 300 nm, particularly from 50 to 100 nm. As described above, a substrate for an EUV mask blank is prepolished by abrasive grains, followed by being cleaned. Accordingly, no concave defect having an extremely large size exists on the deposition surface of the substrate. The depth of a concave defect existing on the deposition surface is 30 nm at the most. From this point of view, when the thickness of film 2 is 50 nm or above, the depth of a concave defect that appears on the surface of the film 2 can be successfully reduced by subjecting the film 2 to heat treatment as described later, with the result that it is possible to improve the smoothness of the surface of the film 2. When the thickness of the film 2 is 20 nm or above, it is possible to reduce the thickness of a concave defect by diffusion of the film. When the thickness of the film 2 is beyond 300 nm, a stress generated in the film 2 causes a crack in the film 2, forming a new defect.

The method for forming the film 2 is not limited to a specific method as long as the method is performed by a dry deposition method. It is acceptable to use a known dry deposition method, such as various kinds of sputtering, CVD, PVD, electron beam deposition and a flame deposition method. However, it is preferred to use a vacuum deposition method in order to prevent foreign particles from mixing into the film 2. The flame deposition method is a method wherein a raw material gas comprising, e.g. $SiCl_4$ is supplied to a burner, fine particles of glass are deposited on a substrate by hydrolysis reaction or oxidation reaction in a flame of oxyhydrogen, and the deposited particles are heated to a high temperature to form a desired layer.

In the flame deposition method, a raw material comprising, e.g., $SiCl_4$, $POCl_3$ or $BCl_3$ is supplied to a burner to form a film, and the film is heated for 1 to 3 hours in an atmosphere comprising 80% or above by volume of He and the remaining volume of oxygen at a temperature of from 1,200 to 1,300° C., with the result that the film turns into transparent glass to form the film 2.

Next, by heating the film 2 at a temperature of not lower than the fluid point Tf and of not higher than the strain point Ts of the substrate 1, the film 2 is turned into such a state to be capable of flowing so as to bury a defect, more specifically that fluidized film 2 comprising glass material has a viscosity of $1 \times 10^7$ poise (1 Pa·s=10 poise) or below. By reducing the viscosity to $1 \times 10^7$ poise, the film 2 turns to flowable. It is preferred from the viewpoint of the film 2 being freely flowable that the film 2 have a viscosity of $1 \times 10^6$ poise or below, in particular $1 \times 10^5$ poise or below.

Since the film 2 comprises a glass material, the film adapts itself well to the deposition surface of the substrate 1, which comprises glass having a low thermal expansion coefficient, such as $SiO_2$—$TiO_2$ glass or crystallized glass with a β-quartz solid solution precipitated. Accordingly, the film spreads out uniformly on the deposition surface of the substrate 1 without making beads at the time of fluidation. When the film spreads out, the material forming the film 2 around the concave defect 10 moves into the concave defect 10. Thus, the concave defect 10 is buried with the material forming the film 2.

When the film 2 has a temperature of less than Tf at the time of heat treatment, it is impossible to fluidize the film 2. When the film 2 has a temperature of higher than the strain point Ts of the substrate 1 at the time of heat treatment, there is a possibility that the substrate 1 is deformed.

The proper temperature for heat treatment varies according to the material forming the film 2. It should be noted that as the temperature for heat treatment increases, a stress generated in the film 2 during cooling increases to raise the possibility that a crack or a defect is caused in the film 2. In order to avoid these problems, it is preferred that the temperature for heat treatment is as low as possible as long as the temperature is not lower than the Tf and not higher than 150° C. It is improper to perform heat treatment at a temperature beyond 700° C. in terms of effectiveness.

On the other hand, in order to smooth such a concave defect, it is advantageous to heat the film 2 to a temperature of significantly higher than Tf to provide the film with satisfactory fluidity. From this point of view, the temperature of heat treatment preferably ranges from Tf+50° C. to Tf+300° C.

In the substrate concave-defect smoothing method according to the present invention, it is necessary to regard the flatness of the film as being important as in the substrate. From this point of view, it is preferred to perform film formation and heat treatment with the substrate being horizontally held.

In the substrate concave-defect smoothing method according to the present invention, there is no limitation to the means for heating the film 2 to a temperature of not lower than the fluid point Tf and not higher than the strain point Ts of the substrate 1. A known heating means may be used to perform the method. Specifically, the film 2 may be heated by a heater, such as a halogen heater, or the film 2 may be irradiated with a laser to be heated, for example. In spite of directly heating the film 2, the substrate 1 may be heated to indirectly heat the film 2.

Figure 3:
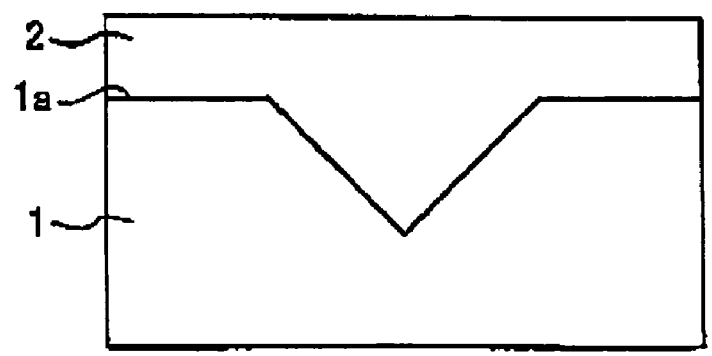
FIG. 3 shows a state wherein the film 2 shown in FIG. 2 is subjected to heat treatment and then is cooled.

When the film 2 is cooled to a temperature of not higher than Tf after heat treatment, the film 2 loses fluidity and be solidified. FIG. 3 shows a state wherein the film 2 shown in FIG. 2 is subjected to heat treatment, followed by being cooled. As shown in FIG. 3, the surface of the film after cooling has the concave defect 10 buried with the film 2, having an excellent smoothness.

When the substrate 1 shown in FIG. 3 is used to fabricate an EUV mask blank, a reflective multilayer film and an absorbing layer are deposited on the surface of the film 2, which has been formed on the deposition surface 1a of the substrate 1. From this point of view, the surface of the film 2 may also be regarded as being the deposition surface of the substrate 1 in FIG. 3.

Although the concave defect 10 is completely buried with the film in FIG. 3, the present invention is not necessarily limited to this mode. In the substrate concave-defect smoothing method according to the present invention, the concave defect 10 is allowed to exist on the surface of the film 2 as long as the concave defect 10, which has been buried with the film 2, has such a depth that no problem is caused in terms of substrate for an EUV mask blank. It is preferred that the concave defect 10 on the surface of the film 2 after cooling have a depth of 3 nm, in particular 1 nm or below. When the concave defect 10 on the surface of the film 2 after cooling has a depth of 3 nm, in particular 1 nm or below, no problem is caused in terms of substrate for an EUV mask blank.

In order to fabricate a substrate with a reflective multilayer film for an EUV mask blank by using a substrate for an EUV mask blank, which has had a deposition surface (the surface of the film 2) smoothed by the above-mentioned steps, the reflective multilayer film may be deposited on the surface of the film 2 shown in FIG. 3 by using a known deposition method, specifically, a sputtering method, such as a magnetron sputtering method or an ion beam sputtering method.

There is no limitation to the reflective multilayer film deposited on the surface of the film 2 as long as the reflective multilayer film has characteristics required as a reflective multilayer film of an EUV mask blank. The particularly required characteristic for the reflective multilayer film is that the reflective multilayer film is a film having a high reflectivity with respect to EUV light. Specifically, it is preferred that when a reflective multilayer film is irradiated with a ray in the wavelength range of EUV light, the reflective multilayer film have a maximum reflectivity of 60% or above, particularly 65% or above with respect to a ray having a wavelength of about 13.5 nm.

Examples of the reflective multilayer films satisfying the above-mentioned characteristic include a Si/Mo reflective multilayer film with Si films and Mo films alternately stacked therein, a Be/Mo reflective multilayer film with Be films and Mo films alternately stacked therein, a Si compound/Mo compound reflective multilayer film with Si compound layers and Mo compound layers alternately stacked therein, a Si/Mo/Ru reflective multilayer film with a Si film, a Mo film and a Ru film stacked in this order therein, and a Si/Ru/Mo/Ru reflective multilayer film with a Si film, a Ru film, a Mo film and a Ru film stacked in this order therein. The process for depositing a reflective multilayer film on the surface of the film 2 may be a process, which is normally performed when a reflective multilayer film is deposited by a sputtering method. For example, when a Si/Mo reflective multilayer film is formed by an ion beam sputtering method, a Si target is used as the target, and it is preferred that an Ar gas (having a gas pressure of $1.3 \times 10^{-2}$ Pa to $2.7 \times 10^{-2}$ Pa) is used as the sputtering gas to deposit a Si film so as to have a thickness of 4.5 nm at an ion accelerating voltage of from 300 to 1,500 V and at a deposition rate of from 0.03 to 0.30 nm/sec. Next, it is preferred that a Mo target is used as the target, that an Ar gas (having a gas pressure of from $1.3 \times 10^{-2}$ Pa to $2.7 \times 10^{-2}$ Pa) is used as the sputtering gas to deposit a Mo film so as to have a thickness of 2.3 nm at an ion accelerating voltage of from 300 to 1,500 V and at a deposition rate of from 0.03 to 0.30 nm/sec. These steps form one cycle. The Si/Mo reflective multilayer film is deposited by stacking Si films and Mo films at cycles of from 40 to 50. In order to obtain a uniform film deposition when depositing a reflective multilayer film, it is preferred that film deposition is made while the substrate is rotated by using a rotator.

In order to prevent a surface of a reflective multilayer film from being oxidized, it is preferred that the top layer of the reflective multilayer film comprise a layer which is made of a material difficult to be oxidized. The layer made of a material difficult to be oxidized serves as a capping layer of the reflective multilayer film. A specific example of the layer, which is made of a material difficult to be oxidized and serves as a capping layer, is a Si layer. When the reflective multilayer film comprises a Si/Mo film, the top layer can serve as a capping layer by forming the top layer from the Si layer. In this case, it is preferred that the capping layer have a film thickness of 11.0±1.0 nm.

In order to fabricate an EUV mask blank by using a substrate with a reflective multilayer film for an EUV mask blank obtained in the above-mentioned process, when the reflective multilayer film, which has been deposited by the above-mentioned process, has a capping layer as the top layer, an absorbing layer may be deposited on the capping layer by using a known deposition method, specifically, a sputtering method, such as a magnetron sputtering method or an ion beam sputtering method.

An example of the material forming the absorbing layer deposited on a reflective multilayer film is a material having a high absorption coefficient with respect to EUV light, specifically Cr, Ta or a nitride thereof. Among them, TaN and TaBN are preferred because these nitrides are likely to turn amorphous and have a smooth surface shape. It is preferred that the absorbing layer have a thickness of from 50 to 100 nm. There is no limitation to the method for depositing the absorbing layer as long as a sputtering method is used. Either one of a magnetron sputtering method and an ion beam sputtering method may be used.

When a TaN layer is deposited as the absorbing layer by using an ion beam sputtering method, it is preferred that a Ta target be used as the target, and that a $N_2$ gas (having a gas pressure of from $1.3 \times 10^{-2}$ Pa to $2.7 \times 10^{-2}$ Pa) be used as the sputtering gas to deposit the TaN layer so as to have a thickness of from 50 to 100 nm at a voltage of from 300 to 1,500 V and at a deposition rate of from 0.01 to 0.1 nm/sec.

When depositing the absorbing layer by using a sputtering method, it is preferred for the purpose of obtaining uniform film deposition that the film deposition be performed while the substrate is rotated by using a rotor.

A buffer layer may be deposited between the absorbing layer and the reflective multilayer film. Examples of the material forming the buffer layer include Cr, Al, Ru, Ta, a nitride thereof. $SiO_2$, $Si_3N_4$ and $Al_2O_3$. It is preferred that the buffer layer have a thickness of from 10 to 60 nm.

EXAMPLES

Now, the present invention will be further described based on examples.

Example 1

In this example, the deposition surface of a substrate for an EUV mask blank is smoothed by the process shown in FIG. 1 through FIG. 3. The substrate for deposition 1 comprises a $SiO_2$—$TiO_2$ glass substrate (having outer dimensions of 6 inch (152.4 mm) square and a thickness of 6.3 mm). This glass substrate has a thermal expansion coefficient of $0.2 \times 10^{-7}$/° C., a Young' modulus of 67 GPa and a strain point Ts of 1,100° C. The deposition surface 1a of the glass substrate 1 is polished so as to have a surface roughness of 0.15 nm or below in RMS (root-mean-square) and a flatness of 100 nm or below. The depth of a concave defect 10 existing on the deposition surface 1a after polishing and the surface roughness in RMS of the deposition surface 1a (1 μm×1 μm) in the vicinity of the concave defect 10 are measured by an atomic force microscope (AFM). The results are shown in Table 1.

A film 2 (having a thickness of 70 nm), which is made of a glass material, is deposited on the deposition surface 1a of the substrate 1 by a CVD method. The glass material comprises oxide glass (having a fluid point Tf of 400° C.), which contains phosphorus, boron and silicon as the main components.

The deposition conditions in the CVD method are as follows:
Process gas: $SiCl_4$, $PCl_3$, $BCl_3$, $O_2$
Diluent gas: He/Ar
Deposition atmosphere: 0.1 Torr
Temperature of substrate 1 during film deposition: 350° C.

The film 2 after deposition is heated to 650° C. by a halogen lamp heater under vacuum, providing the film 2 with a viscosity of $1 \times 10^7$ poise or below. The film 2 is held for 15 minutes as it is, followed by being cooled.

The depth of a concave defect 10 on the surface of the film 2 after cooling and the surface roughness (RMS) of the surface of the film in the vicinity of the concave defect 10 (1 μm×1 μm) are measured by an AFM. The results are shown in Table 1.

Next, a reflective multilayer film (Si/Mo reflective multilayer film) is deposited on the surface of the film 2 by use of an ion beam sputtering method. Specifically, alternating deposition of a Si film and Mo film is repeated 50 times to deposit a Si/Mo reflective multilayer film having a total film thickness of 340 nm ((4.5+2.3)×50).

The deposition conditions for Si films and Mo films are as follows:

Deposition Condition for Si Films
  Target: Si target (having boron doped therein)
  Sputtering gas: Ar gas (having a gas pressure of 0.02 Pa)
  Voltage: 700 V
  Deposition rate: 0.077 nm/sec
  Film thickness: 4.5 nm Deposition Conditions for Mo Films
  Target: Mo target
  Sputtering gas: Ar gas (having a gas pressure of 0.02 Pa)
  Voltage: 700 V
  Deposition rate: 0.064 nm/sec
  Film thickness: 2.3 nm The surface roughness (RMS) of the reflective multilayer film surface (a portion of the deposition surface 1a with the concave defect 10 existing thereon and its neighboring area) after film deposition is measured by the AFM. The result is shown in Table 1. It should be noted that no concave defect is recognized on the reflective multilayer film surface.

The reflective multilayer film surface after film deposition is irradiated with EUV light, and the reflectivity with respect to EUV light having a wavelength of 13.5 nm is measured by a spectrophotometer.

The result is shown in Table 1.

The reflective multilayer film surface (the portion of the deposition surface 1a with the concave defect 10 existing thereon and its neighboring area) after film deposition is observed by an EUV microscope having a Schwarzschild optical system (having a wavelength of 13.5 nm). The results are shown in Table 1, wherein a case where the image of a defect is observed is indicated by "◯" and a case where the image of a defect is not observed is indicated by "X".

Comparative Example 1

In this comparative example, a reflective multilayer film (Si/Mo reflective multilayer film) is directly deposited on the deposition surface 1a of a substrate 1 without forming a film 2 made of a glass material on the deposition surface. The deposition conditions, the film thickness and the like for the reflective multilayer film are the same as those in Example 1.

The surface shape, the reflectivity with respect to EUV light and observation through an EUV microscope with respect to a reflective multilayer film surface after film deposition are measured in the same way as Example 1. The results are shown in Table 1.

Examples 2 to 5

Each of the examples is done in the same way as Example 1 except that the depth of a concave defect existing on the deposition surface 1a, and the surface roughness (RMS) of the deposition surface 1a in the vicinity of the concave defect 10 (1 μm×1 μm) are the values shown in Table 1. The results are shown in Table 1.

Examples 6 to 10

Each of the examples is done using a substrate 1 having a concave defect in the same way as Example 1 except that the depth of the concave defect 10 existing on the deposition surface 1a, and the surface roughness (RMS) of the deposition surface 1a in the vicinity of the concave defect 10 (1 μm×1 μm) are the values shown in Table 2.

In each of the examples, a film 2 (having a thickness of 50 nm), which is made of a glass material, is deposited on the deposition surface 1a of the surface 1 by an RF sputtering method. The glass material is lead borate glass (having a fluid point Tf of 350° C.), which comprises PbO (85.7 wt %), $B_2O_3$ (12.3 wt %), $SiO_2$ (1 wt %) and $Al_2O_3$ (1 wt %). The deposition conditions in the RF sputtering method are as follows:

Process gas: 99% of Ar and 1% of oxygen
Deposition atmosphere: 0.02 Torr
Temperature of substrate for film deposition: 25° C.

In each of the examples, the film 2 after film deposition is heated to 500° C. by a halogen lamp heater under vacuum, providing the film 2 with a viscosity of $1\times10^4$ poise or below. The heated film 2 is left for 20 minutes as it is, followed by being cooled.

The depth of the concave defect 10 on the surface of the film 2 after cooling, and the surface roughness in RMS (root-mean-square) of the surface of the film 2 in the vicinity of the concave defect 10 (1 μm×1 μm) are measured by the AFM. The results are shown in Table 2.

In each of the examples, a reflective multilayer film (Si/Mo reflective multilayer film) is deposited on the surface of the film 2 by an ion beam sputtering method as in Example 1. The surface roughness of the reflective multilayer film surface after film deposition is measured by the AMP. The results are shown in Table 2. In each of the examples, no concave defect is recognized on the reflective multilayer film surface.

The EUV light reflectivity on the reflective multilayer film surface after film deposition in each of these examples is measured by the same way as Example 1. The results are shown in Table 2.

Comparative Example 2

In this comparative example, a reflective multilayer film (Si/Mo multilayer reflective layer) is directly deposited on the deposition surface 1a of a substrate 1 without forming a film 2 made of a glass material on the deposition surface. The deposition conditions, the film thickness and the like for the reflective multilayer film are the same as those in Example 1.

The surface shape, the EUV light reflectivity, and observation by the EUV microscope with respect to the reflective multilayer film surface after film deposition are measured in the same way as Example 1. The results are shown in Table 2.

TABLE 1

| | Deposition surface | | Surface of film 2 | | Reflective multilayer film surface | | | |
|---|---|---|---|---|---|---|---|---|
| | Depth of concave defect (nm) | Surface roughness (nm) | Depth of concave defect (nm) | Surface roughness (nm) | Depth of concave defect (nm) | Surface roughness (nm) | EUV reflectivity (%) | Observation by EUV microscope |
| Ex. 1 | 3.3 | 0.109 | 0.3 | 0.101 | — | 0.170 | 65.5 | X |
| Ex. 2 | 6.2 | 0.099 | 0.5 | 0.109 | — | 0.165 | 65.4 | X |
| Ex. 3 | 10.2 | 0.111 | 0.5 | 0.099 | — | 0.168 | 65.5 | X |
| Ex. 4 | 15.8 | 0.125 | 0.4 | 0.104 | — | 0.167 | 65.5 | X |
| Ex. 5 | 23.3 | 0.122 | 0.7 | 0.105 | — | 0.169 | 65.6 | X |
| Comp. Ex. 1 | 3.4 | 0.127 | — | — | 3.1 | 0.173 | 65.5 | ◯ |

TABLE 2

| | Deposition surface 1a | | Surface of film 2 | | Reflective multilayer film surface | | | |
|---|---|---|---|---|---|---|---|---|
| | Depth of concave defect (nm) | Surface roughness (nm) | Depth of concave defect (nm) | Surface roughness (nm) | Depth of concave defect (nm) | Surface roughness (nm) | EUV reflectivity (%) | Observation by EUV microscope |
| Ex. 6 | 4.2 | 0.113 | 0.3 | 0.11 | — | 0.172 | 65.2 | X |
| Ex. 7 | 7.2 | 0.117 | 0.6 | 0.112 | — | 0.166 | 65.2 | X |
| Ex. 8 | 10.9 | 0.121 | 0.5 | 0.115 | — | 0.173 | 65.1 | X |
| Ex. 9 | 14.4 | 0.12 | 0.5 | 0.105 | — | 0.173 | 65.3 | X |
| Ex. 10 | 28.4 | 0.127 | 0.8 | 0.103 | — | 0.171 | 65.3 | X |
| Comp. Ex. 2 | 5.0 | 0.119 | — | — | 4.7 | 0.179 | 65.3 | ○ |

As shown in Table 1 and Table 2, the depth of the concave defect can be reduced to 3 μm or below, particularly 1 nm or below, further 0.5 nm or below without deteriorating the surface roughness of the surface of the film 2 in each of Examples 1 to 10. A comparison of the examples with the comparative examples clearly shows that the presence of each of the films 2 can restrain a phase defect with respect to an EUV wavelength after deposition of each of the reflective multilayer film, without having an adverse effect on the EUV reflectivity of each of the reflective multilayer films.

What is claimed is:

1. A method for smoothing a surface of a glass substrate for an EUV mask blank, comprising:
   providing a glass substrate having a surface on which a concave defect with a depth of more than 3 nm exists after polishing the glass substrate to have a surface roughness of 0.15 nm or below in Rms;
   forming a film comprising a glass material on the surface of the glass substrate having the concave defect by a vacuum deposition method, the glass material having a fluid point Tf of 150° C. or above and of not higher than a strain point Ts (° C.) of the glass substrate;
   heating the film of the glass material at a temperature of not lower than Tf and not higher than Ts such state such that the film of the glass material flows and buries the concave defect; and
   cooling the film of the glass material, thereby to reduce the depth of the concave defect to 3 nm or below.

2. The method according to claim 1, wherein the glass material comprises oxide glass containing phosphorus, boron and silicon as main components.

3. The method according to claim 1, wherein the film comprising the glass material before heat treatment has a thickness of from 20 to 300 nm.

4. The method according to claim 1, wherein the concave defect on the surface of the glass substrate has the depth of 30 nm or below.

5. The method according to claim 1, wherein the glass substrate comprises a $SiO_2$—$TiO_2$ glass.

6. The method according to claim 1, wherein before the heating the film of glass material has a thickness equal to or larger than the depth of the concave defect.

7. The method according to claim 1, wherein the vacuum deposition method is selected from the group consisting of sputtering, chemical vapor deposition and electron beam deposition.

8. The method according to claim 1, further comprising producing a reflective mask blank by a process comprising forming a reflective film on the smoothed surface of the glass substrate having the concave defect.

9. A method for smoothing a surface of a glass substrate for an EUV mask blank, comprising:
   providing a glass substrate having a surface on which a concave defect with a depth of more than 3 nm exists after polishing the glass substrate to have a surface roughness of 0.15 nm or below in Rms;
   forming a film comprising a glass material on an entire surface of the glass substrate having the concave defect by a dry deposition method, the glass material having a fluid point Tf of 150° C. or above and of not higher than a strain point Ts (° C.) of the glass substrate;
   heating the film of the glass material at a temperature of not lower than Tf and not higher than Ts such state such that the film of the glass material flows and buries the concave defect; and
   cooling the film of the glass material, thereby to reduce the depth of the concave defect to 3 nm or below.

10. The method according to claim 9, wherein the glass material comprises oxide glass containing phosphorus, boron and silicon as main components.

11. The method according to claim 9, wherein the film comprising the glass material before heat treatment has a thickness of from 20 to 300 nm.

12. The method according to claim 9, wherein the concave defect on the surface of the glass substrate has depth of 30 nm or below.

13. The method according to claim 9, wherein the glass substrate comprises a $SiO_2$—$TiO_2$ glass.

14. The method according to claim 9, wherein before the heating the film of glass material has a thickness equal to or larger than the depth of the concave defect.

15. The method according to claim 9, wherein the dry deposition method is selected from the group consisting of a vacuum deposition method and a flame deposition method.

16. The method according to claim 15, wherein
   the dry deposition method is the vacuum deposition method; and
   the vacuum deposition method is selected from the group consisting of sputtering, chemical vapor deposition and electron beam deposition.

17. The method according to claim 9, further comprising producing a reflective mask blank by a process comprising forming a reflective film on the smoothed surface of the glass substrate having the concave defect.

18. A method for smoothing a surface of a glass substrate for an EUV blank, comprising:
   providing a glass substrate having a surface on which a concave defect with a depth of more than 3 nm exists after polishing the glass substrate to have a surface roughness of 0.15 nm or below in Rms;

forming a film comprising a glass material on the surface of the glass substrate having the concave defect by a dry deposition method, the glass material having a fluid point Tf of 150° C. or above and of not higher than a strain point Ts (° C.) of the glass substrate;

heating the film of the glass material at a temperature of not lower than Tf and not higher than Ts such state such that the film of the glass material flows and buries the concave defect; and cooling the film of the glass material, thereby to reduce the depth of the concave defect to 3 nm or below and smooth the surface of the glass substrate having the concave defect so that the smoothed surface of the glass substrate has a surface roughness of 0.15 nm or below in Rms.

19. The method according to claim 18, further comprising producing a reflective mask blank by a process comprising forming a reflective film on the smoothed surface of the glass substrate having the concave defect.

\* \* \* \* \*